United States Patent
Narumi et al.

(10) Patent No.: US 11,942,747 B2
(45) Date of Patent: Mar. 26, 2024

(54) PART GRIPPING TOOL

(71) Applicant: FUJI CORPORATION, Aichi (JP)

(72) Inventors: Kenta Narumi, Chiryu (JP);
Katsumoto Sugiyama, Nishio (JP);
Takeshi Fujishiro, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/654,982

(22) Filed: Mar. 15, 2022

(65) Prior Publication Data

US 2022/0209484 A1 Jun. 30, 2022

Related U.S. Application Data

(63) Continuation of application No. 16/645,692, filed as application No. PCT/JP2017/035280 on Sep. 28, 2017, now abandoned.

(51) Int. Cl.
*H01R 43/20* (2006.01)
*H05K 13/04* (2006.01)

(52) U.S. Cl.
CPC ....... *H01R 43/205* (2013.01); *H05K 13/0408* (2013.01); *H05K 13/0419* (2018.08); *H05K 13/0426* (2013.01)

(58) Field of Classification Search
CPC .... B23Q 7/04; H01R 43/205; H05K 13/0408; H05K 13/0419; H05K 13/0426
See application file for complete search history.

(56) References Cited

U.S. PATENT DOCUMENTS

| | | | |
|---|---|---|---|
| 4,327,489 A * | 5/1982 | Conrad | A21C 11/106 D7/676 |
| 5,277,689 A | 1/1994 | Ruetschle | |
| 5,832,597 A * | 11/1998 | Yokoyama | H05K 13/0426 29/564.6 |
| 6,330,738 B1 | 12/2001 | Yoshikawa | |
| 7,845,698 B2 * | 12/2010 | Jenkins | B25J 9/1005 294/115 |
| 10,632,582 B2 | 4/2020 | Gunther | |
| 2006/0130304 A1 | 6/2006 | Roy | |
| 2020/0266597 A1 | 8/2020 | Narumi | |
| 2022/0209484 A1 * | 6/2022 | Narumi | H05K 13/0408 |

FOREIGN PATENT DOCUMENTS

| | | |
|---|---|---|
| JP | 60-109830 U | 7/1985 |
| JP | 60-117039 U | 8/1985 |
| JP | 09-8496 A | 1/1997 |

OTHER PUBLICATIONS

International Search Report issued in PCT/JP2017/035280 dated Nov. 14, 2017.

* cited by examiner

*Primary Examiner* — Minh N Trinh
(74) *Attorney, Agent, or Firm* — Oblon, McClelland, Maier & Neustadt, L.L.P.

(57) ABSTRACT

A component gripping tool including: a pair of claws configured to grip multiple pins or leads of an electronic component; a contact surface provided between the pair of claws and configured to contact a leading end of at least two of the multiple pins or leads being gripped by the pair of claws, wherein an escape section is formed in the contact surface such that the pair of claws and the contact surface do not interfere with each other when the pair of claws is gripping the two multiple pins or leads.

4 Claims, 13 Drawing Sheets

PART GRIPPING TOOL

CROSS-REFERENCE TO RELATED APPLICATIONS

This application is a continuation of U.S. application Ser. No. 16/645,692 filed Mar. 9, 2020, now abandoned, the entire contents of which is incorporated herein by reference. U.S. application Ser. No. 16/645,692 is a 371 of International Application No. PCT/JP2017/035280 filed Sep. 28, 2017.

TECHNICAL FIELD

The present disclosure relates to a component gripping tool for gripping an electronic component by closing a pair of claws.

BACKGROUND ART

Known component gripping tools grip an electronic component by closing a pair of claws, as described in the following patent literature.

CITATION LIST

Patent Literature

Patent literature 1: JP-A-60-117039
Patent literature 2: JP-A-60-109830

BRIEF SUMMARY

Technical Problem

It is an object of the present disclosure to appropriately grip an electronic component by closing a pair of claws.

Solution to Problem

To solve the above problem, disclosed herein is a component gripping tool including: a pair of claws configured to grip multiple pins or leads of an electronic component; a contact surface provided between the pair of claws and configured to contact a leading end of at least two of the multiple pins or leads being gripped by the pair of claws, wherein an escape section is formed in the contact surface such that the pair of claws and the contact surface do not interfere with each other when the pair of claws is gripping the multiple pins or leads.

Advantageous Effects

In the present disclosure, a leading end of at least two pins or leads of multiple pins or leads being gripped by a pair of claws contacts a contact surface provided between the pair of claws. Further, an escape section is formed in the contact surface such that the pair of claws and the contact surface do not interfere with each other while the pair of claws is gripping the multiple pins or leads. As a result, interference between the claws and the contact surface is curtailed, and the electronic component can be gripped appropriately by the closing of the pair of claws.

DESCRIPTION OF EMBODIMENTS

The following describes in detail referring to the figures an example embodiment of the present disclosure.

(A) Configuration of Component Mounter

Figure 1:
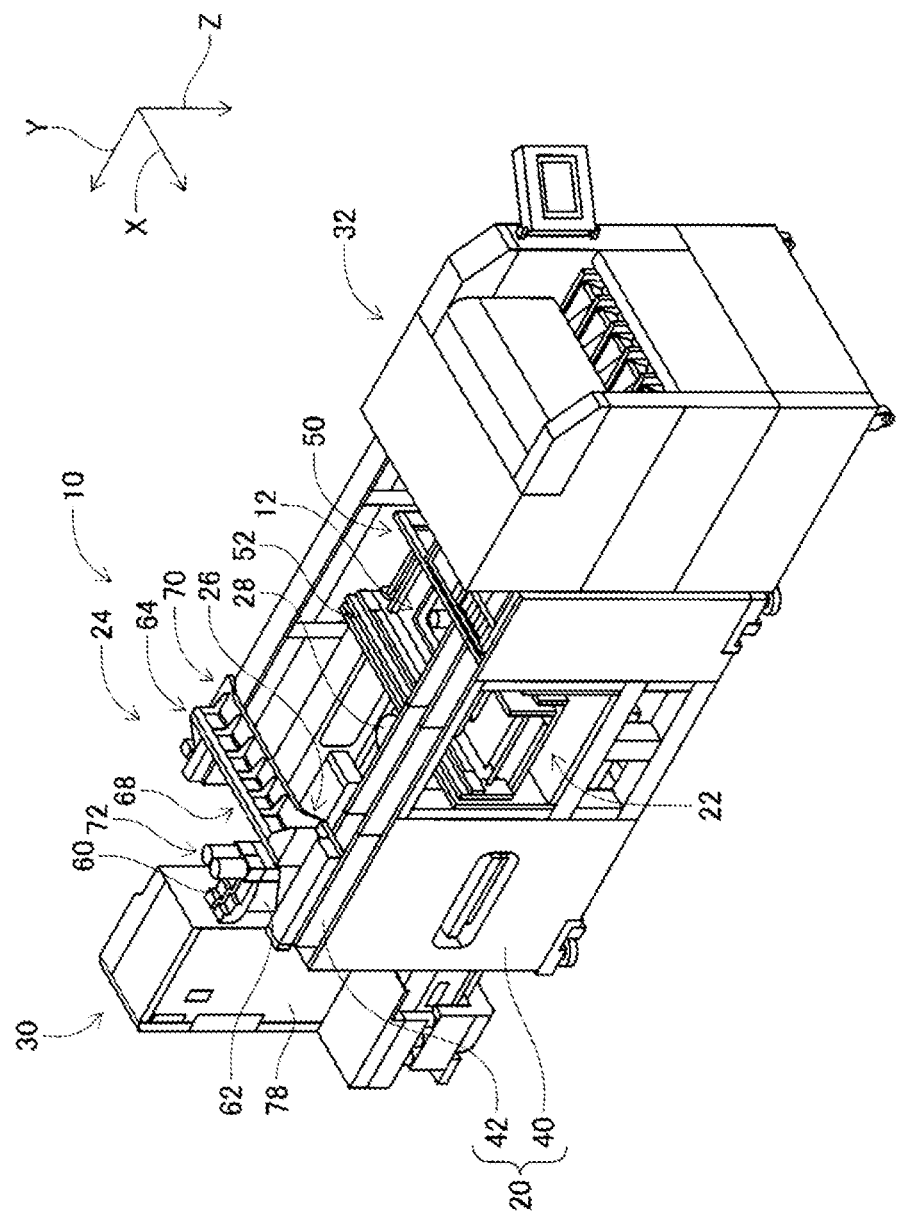
FIG. 1 is a perspective view showing a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, and loose component supply device 32. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
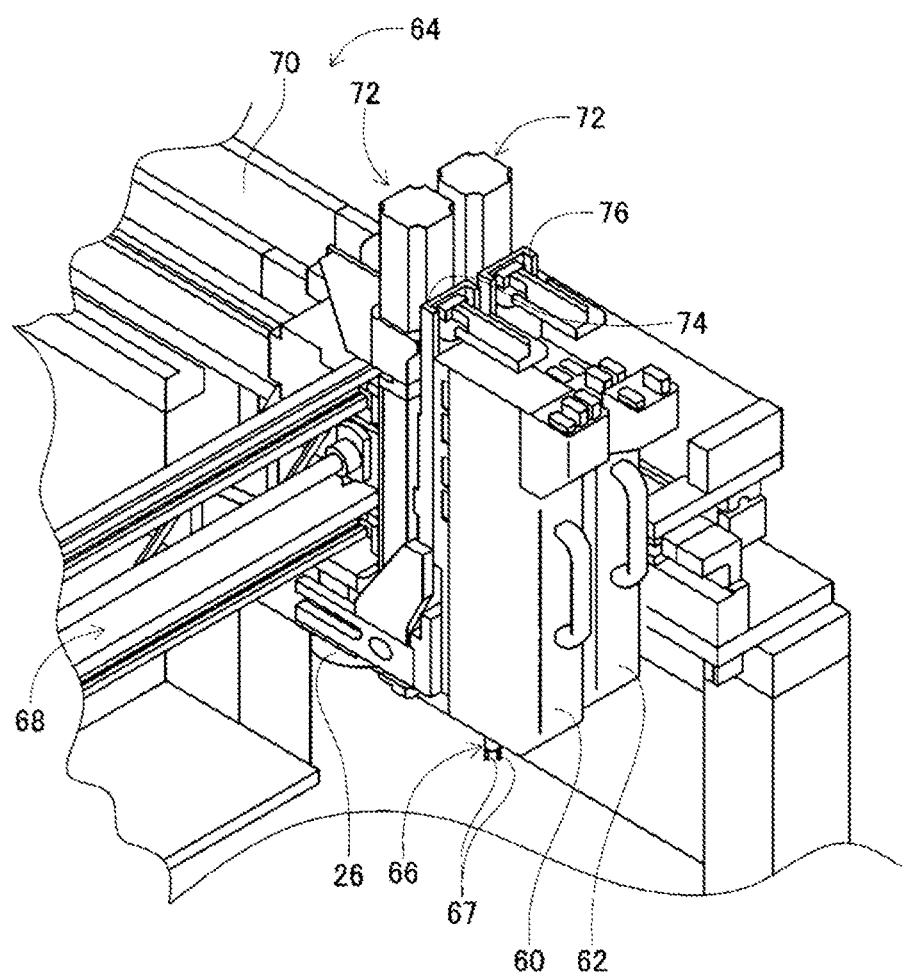
FIG. 2 is a perspective view of a component mounting device of the component mounter.

Component mounting device 24 is provided on beam section 42, and includes work heads 60 and 62 and work head moving device 64. As shown in FIG. 2, component gripping tool 66 is detachably provided on a lower end surface of working head 60 and 62. Component gripping tool 66 includes pair of claws 67, and grips a component by closing the pair of claws 67, and releases the gripped component by opening the pair of claws. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. Thus, imaging device 28 images a component held by component gripping tool 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. Note that, components supplied by component supply device 30 and loose component supply device 32 may include electronic components such as electronic circuit components, configuration components of solar panels, configuration components of power modules, and the like. Also, electronic circuit components include components with leads and components without leads.

(B) Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. One of the work heads 60 or 62 moves above the component supply position and holds a component using component gripping tool 66. Then, work head 60 or 62 holding the component moves above imaging device 28, and the component being held by component gripping tool 66 is imaged by imaging device 28. Accordingly, information related to an error of the holding position of the component is obtained. Continuing, work head 60 or 62 holding the component moves above circuit board 12, and corrects the error in the holding position of circuit board 12 and the error in the holding position of the component and so on. Then, the component is mounted on circuit board 12 by being released by component gripping tool 66.

(C) Structure of Component Gripping Tool

As described above, with component mounter 10, component gripping tool 66 grips the component by closing the pair of claws 67, and releases the component by opening the pair of claws 67 so as to perform mounting operation. The electronic component also includes an electronic component, a so-called pin header, having multiple pins extending up and multiple pins extending down. With such an electronic component, the multiple upwardly extending pins are gripped by component gripping tool 66, and the multiple downwardly extending pins are inserted into multiple through-holes formed in circuit board 12.

Figure 3:
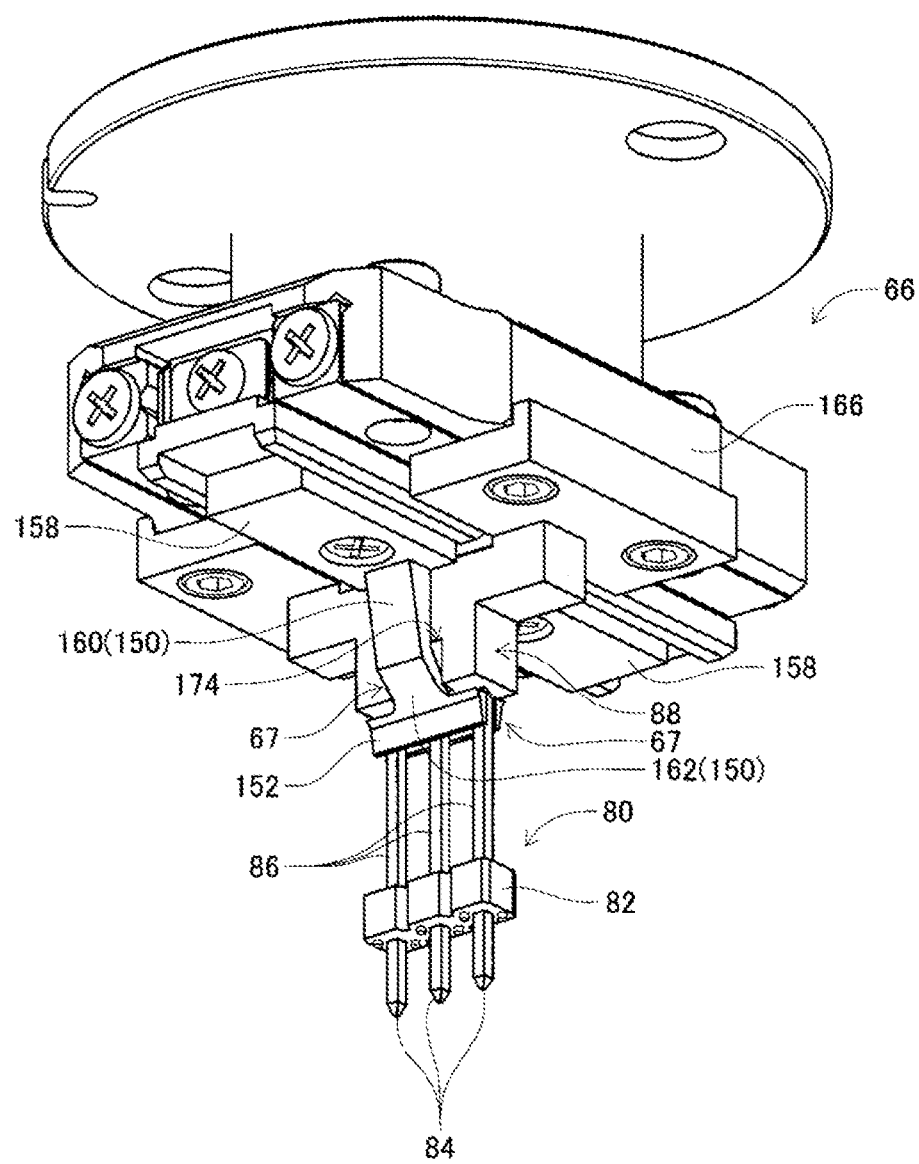
FIG. 3 is a perspective view of a component gripping tool of the present disclosure.

Specifically, for example, as shown in FIG. 3, electronic component 80 includes a generally block-shaped component main body section 82, three lower pins 84 extending down from the lower surface of component main body section 82, and three upper pins 86 extending up from the upper surface of component main body section 82. Further, the three upper pins 86 of electronic component 80 are gripped by pair of claws 67.

Figure 4:
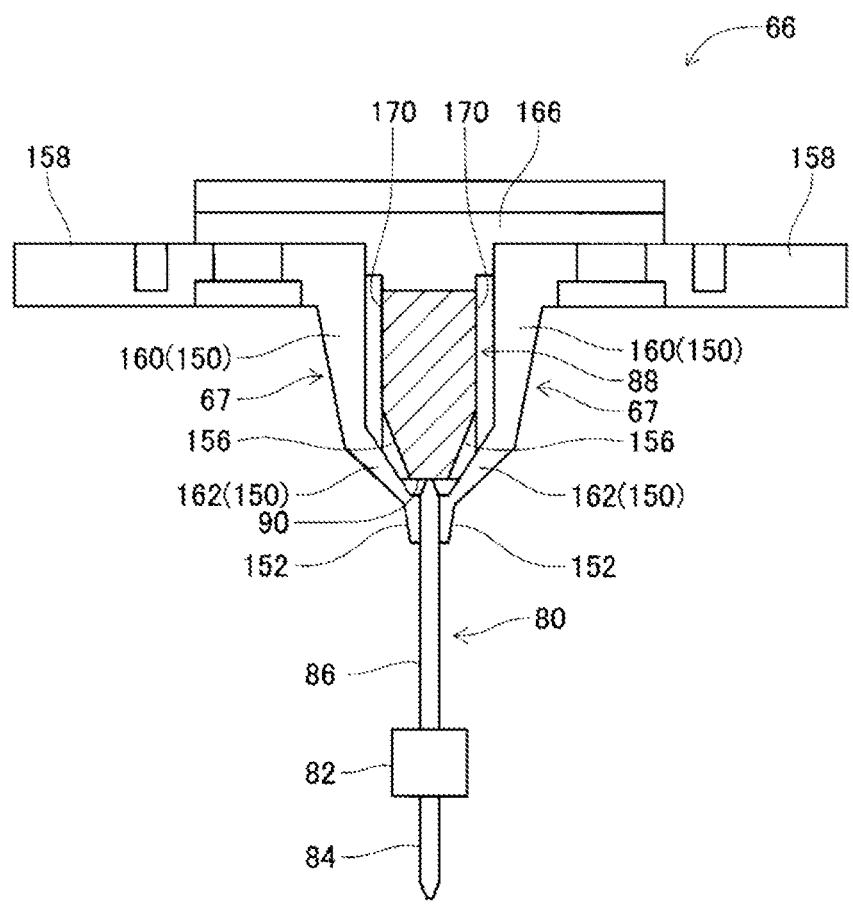
FIG. 4 is a cross-sectional view of the component gripping tool of FIG. 3.

Note that, as shown in FIG. 4, contact block 88 is provided between pair of claws 67, and when the three upper pins 86 are gripped by pair of claws 67, the upper ends of the three upper pins 86 contact a lower surface (hereinafter referred to as "contact surface") 90 of contact block 88. That is, when electronic component 80 is gripped by component gripping tool 66, component gripping tool 66 is lowered until contact surface 90 of contact block 88 contacts the upper end of upper pin 86, and when the upper end of upper pin 86 contacts contact surface 90, pair of claws 67 close to grip upper pins 86.

Next, when the upper pins 86 have been gripped by pair of claws 67, component gripping tool 66, that is, work head 60 to which component gripping tool 66 is attached, is moved above circuit board 12 by the operation of work head moving device 64. Here, operation of work head moving device 64 is controlled such that through-holes (not shown) formed in circuit board 12 and lower pins 84 of electronic component 80 coincide with each other in the XY coordinates, that is, are aligned in the vertical direction. When work head 60 is lowered, the lower pins 84 of electronic component 80 are inserted into the through-holes formed in circuit board 12.

Note that, the outer diameter of lower pins 84 is the same as the inner diameter of the through-holes, or is slightly larger than the inner diameter of the through-holes. When electronic component 80 is gripped by component gripping tool 66, the upper ends of the upper pins 86 are in contact with contact surface 90 of contact block 88. Then, with the upper ends of upper pins 86 contacting contact surface 90 of contact block 88, work head 60 is lowered such that lower pins 84 of electronic component 80 are inserted into the through-holes. As a result, upper pins 86 are pushed in by contact block 88, whereby lower pins 84 are press-fitted into the through-holes of circuit board 12 such that electronic component 80 is mounted on circuit board 12.

Figure 5:
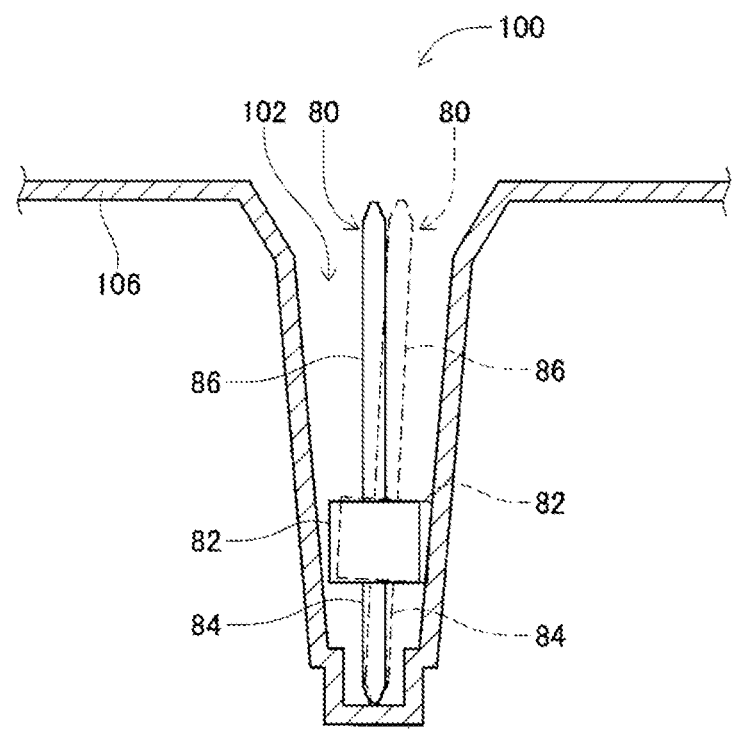
FIG. 5 is a schematic diagram showing taped components.

However, since electronic component 80 is supplied as a tape component, it may be supplied in an inclined state, and in such cases, electronic component 80 may not be properly gripped by a conventional component gripping tool. Specifically, as shown in FIG. 5, taped components 100 are configured from carrier tape 106 in which many accommodation recesses 102 are formed, with electronic components 80 being housed in accommodation recesses 102. Accommodation recess 102 is slightly longer than the length dimension of electronic component 80, such that electronic component 80 is housed in accommodation recess 102 in a state extending in a vertical direction.

Further, claws 67 of component gripping tool 66 are inserted into the gaps between upper pins 86 of the electronic component 80 housed in accommodation recess 102 and the internal walls of accommodation recess 102 and upper pins 86 are gripped by the pair of claws 67. Further, since the gripping position of electronic component 80 by component gripping tool 66 is a specified supply position, each time an electronic component 80 is gripped by component gripping tool 66, carrier tape 106 is fed sequentially in the lengthwise direction of carrier tape 106. As a result, an accommodation recess 102 housing an electronic component 80 arrives at the supply position to supply a new electronic component 80. However, as carrier tape 106 is fed, electronic component 80 housed in accommodation recess 102 may be inclined inside accommodation recess 102 as with the electronic component 80 shown by the dashed line in FIG. 5.

Figure 6:
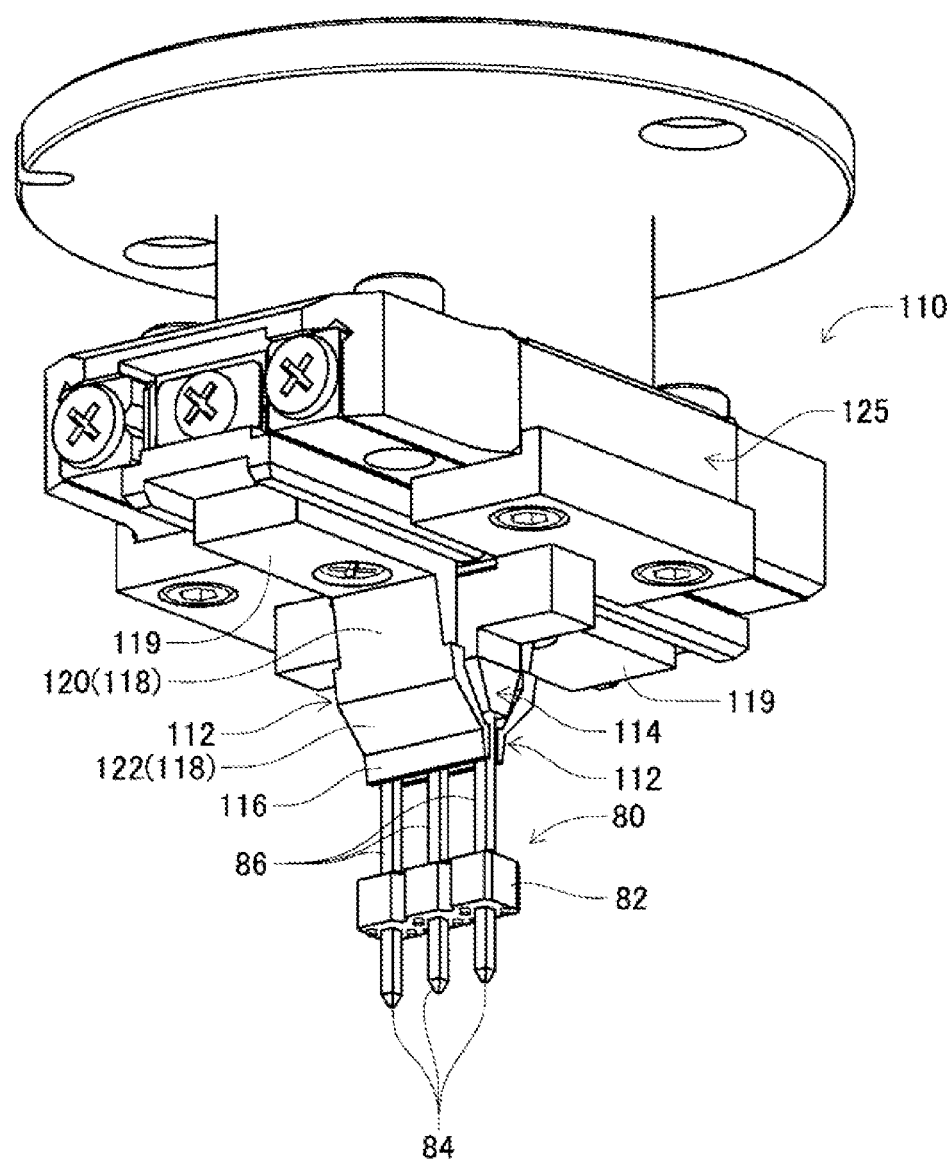
FIG. 6 is a perspective view showing a conventional component gripping tool.
Figure 7:
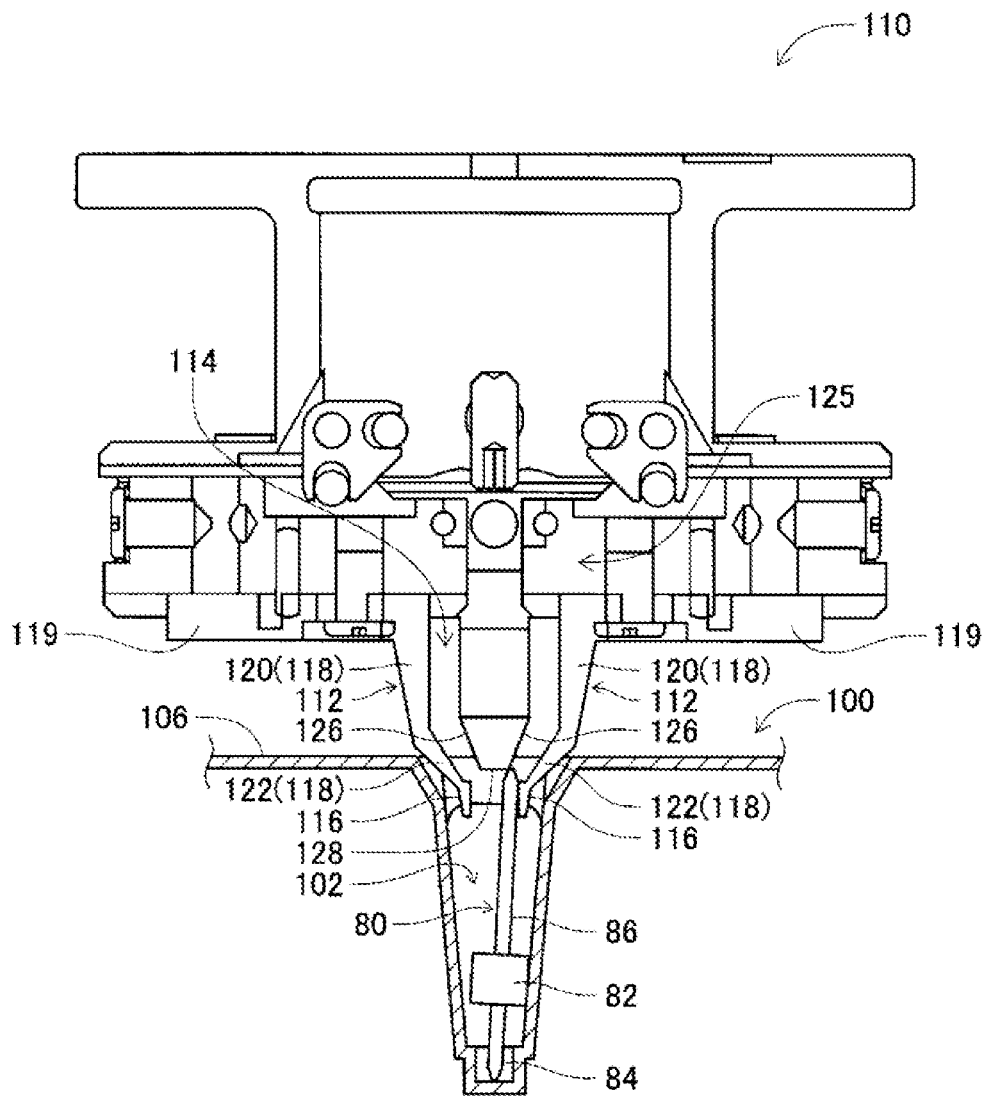
FIG. 7 is a cross-sectional view showing the component gripping tool of FIG. 6.

Here, conventional component gripping tool 110, similar to with component gripping tool 66, as shown in FIGS. 6 and 7, includes pair of claws 112 and contact block 114 provided between pair of claws 112. Each of the pair of claws 112 includes gripping sections 116, arm sections 118, and slide sections 119. Gripping sections 116 are portions for gripping the three upper pins 86 of electronic component 80. Thus, the dimension of gripping section 116 in the widthwise direction is longer than the length dimension of the three upper pins 86 in the direction in which they are arranged side by side. As a result, the three upper pins 86 are gripped together by pair of claws 112. Note that, the length dimension in the direction in which the three upper pins 86 are arranged is the distance between the outsides of the two upper pins 86 located on the outside at both ends of the three upper pins 86 in the direction in which the three upper pins 86 are arranged, which is perpendicular to the direction in which upper pins 86 extend.

Further, arm section 118 is a portion for holding gripping section 116, and is configured from main arm section 120 and bent section 122. Main arm section 120 is provided so as to extend vertically, and is connected to slide section 119 at an upper end portion thereof. Bent section 122 continues down from a lower end of main arm section 120. Further, bent section 122 is bent so as to approach contact block 114 towards the lower end. Gripping section 116 is fixed to the lower end of bent section 122. That is, arm section 118 is bent toward contact block 114 at the lower end, and gripping section 116 is fixed to the lower end of arm section 118.

Also, slide section 119 is slidably held by main body section 125 of component gripping tool 110 in the left-right direction, and pair of claws 112 slide so as to close and open. Therefore, as slide sections 119 slide, pair of claws 112 close such that gripping sections 116 of pair of claws 112 contact each other. Here, pair of arm sections 118 do not touch due to the bending of bent section 122, and pair of arm sections 118 are separated from each other.

Here, the width dimension of arm section 118 is the same as the width dimension of gripping section 116. Therefore, the width dimension of claw 112 is made uniform in the vertical direction, that is, from main arm section 120 to gripping section 116. Note that, the width dimension is a dimension in the left-right direction perpendicular to the sliding direction of claws 112.

Contact block 114 is provided between arm sections 118 of pair of claws 112, and the width dimension of contact block 114 is longer than the length dimension of the three upper pins 86 in the side-by-side direction and slightly longer than the width dimension of claws 112. Further, the thickness of contact block 114 is slightly shorter than the distance between main arm section 120 of pair of arm sections 118 when pair of claws 112 are closest to each other.

Note that, the thickness dimension is a dimension of claw 112 in the sliding direction. However, the side surface of contact block 114 facing bent section 122 of arm section 118 is formed as tapered surface 126 over the entire width direction, and is inclined toward the inside of contact block 88 toward lower surface 128 of contact block 114 (also referred to as "contact surface"). The taper angle of tapered surface 126 is substantially the same as the bending angle of bent section 122 of arm section 118. Therefore, when pair of claws 112 are closest to each other, bent sections 122 of arm section 118 and tapered surfaces 126 of contact block 114 face each other, and contact block 114 is positioned between arm sections 118 of pair of claws 112 without interference between arm section 118 and contact block 114.

With such a configuration, the lower end sections of pair of claws 112 are inserted into accommodation recess 102 of taped components 100 by lowering work head 60 to which component gripping tool 110 is attached while pair of claws 112 are separated from each other. Here, the lower ends of pair of claws 112 are inserted into accommodation recess 102 such that upper pins 86 of electronic component 80 housed in accommodation recess 102 are positioned between gripping sections 116 of pair of claws 112. Further, the upper ends of upper pins 86 of electronic component 80 contact the contact surface 128 of contact block 114 located between pair of claws 112, and upper pins 86 are gripped by gripping sections 116 of pair of claws 112 when the pair of claws 112 closes.

However, as shown in FIG. 7, when electronic component 80 is inclined inside accommodation recess 102, the upper ends of upper pins 86 of electronic component 80 inserted between the lower ends of pair of claws 112 may not contact the contact surface 128 of contact block 114 and may enter between contact block 114 and claws 112. In such a case, the upper ends of upper pins 86 are caught between tapered surface 126 of contact block 114 and claw 112, such that pair of claws 112 cannot close, and upper pins 86 cannot be gripped by pair of claws 112.

In view of the above, with component gripping tool 66, as shown in FIG. 3, the width dimension of arm section 150 of claw 67 is made narrower than the width dimension of gripping section 152, and tapered surface 156 (see FIG. 4) is formed only on a portion of the side surface of contact block 88 facing arm section 150 in the width direction. When pair of claws 67 close, arm sections 150 and tapered surfaces 156 face each other to prevent arm sections 150 from interfering with contact block 88. This allows upper pins 86 of electronic component 80 to be gripped by gripping sections 152 without interference between arm sections 150 and contact block 88. Further, since tapered surface 156 is formed only in a portion of the side surface of contact block 88 in the width direction, the thickness of contact surface 90 of contact block 88 is made longer than the distance between the pair of gripping section 152 except for the position where tapered surface 156 is formed. Further, the thickest thickness dimension of contact surface 90 is set such that at least two upper pins 86 of electronic component 80 contact the contact surface 90 even if electronic component 80 is supplied in an inclined state. As a result, when upper pins 86 of electronic component 80 inclined inside accommodation recess 102 of taped components 100 is gripped by pair of claws 67, the upper ends of at least two upper pins 86 contact the contact surface 90 of contact block 88, such that upper pins 86 can be appropriately gripped by pair of claws 67.

Figure 8:
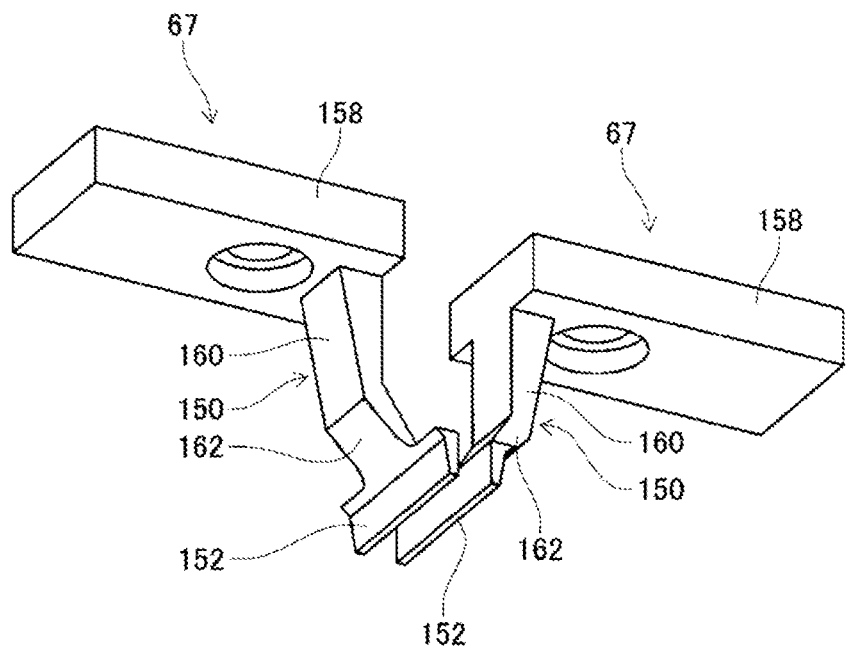
FIG. 8 is a perspective view showing the claws of the component gripping tool of FIG. 3.

Specifically, each of the pair of claws 67 is configured of gripping section 152, arm section 150, and slide section 158, as shown in FIG. 8. Gripping section 152 is a portion for gripping the three upper pins 86 of electronic component 80, and the width dimension of gripping section 152 is longer than the length dimension of the three upper pins 86 in the side-by-side direction, similar to the width dimension of gripping section 116 of conventional component gripping tool 110.

Further, arm section 150 is a portion for holding gripping section 152, and the width dimension of arm section 150 is about one third of the width dimension of gripping section 152. Arm section 150 is configured from main arm section 160 and bent section 162. Main arm section 160 is provided so as to extend vertically, and is connected to slide section 158 at an upper end portion thereof. Bent section 162 continues down from a lower end of main arm section 160. Further, as shown in FIG. 4, bent section 162 is bent so as to approach contact block 88 towards the lower end. The lower end of bent section 162 is fixed to a central section in the width direction of gripping section 152. That is, arm section 150 is bent toward contact block 88 at the lower end, and gripping section 152 having a width dimension that is about three times the width dimension of arm section 150 is fixed to the lower end of arm section 150.

Further, as shown in FIG. 4, slide section 158 is held by main body section 166 of component gripping tool 66 to be slidable in the left-right direction such that pair of claws 67 close and open. Therefore, as slide sections 158 slide, pair of claws 67 close such that gripping sections 152 of pair of claws 67 contact each other. Here, pair of arm sections 150 do not touch due to the bending of bent section 162, and pair of arm sections 150 are separated from each other.

Further, as shown in FIGS. 3 and 4, contact block 88 is provided between arm sections 150 of pair of claws 67. The width dimension of contact block 88 is slightly longer than the width dimension of gripping section 152 (see FIG. 3). In addition, the thickness of contact block 88 is slightly smaller than the distance between main arm sections 160 of the pair of arm sections 150 when the pair of claws 67 come closest to each other, preventing interference when pair of claws 67 is operated (see FIG. 4). However, side surface 170 of contact block 88 facing the pair of arm sections 150 is formed as tapered surface 156 in a portion in the width direction, and tapered surface 156 of contact block 88 is inclined toward the inside of contact block 88 toward contact surface 90 of contact block 88.

Figure 9:
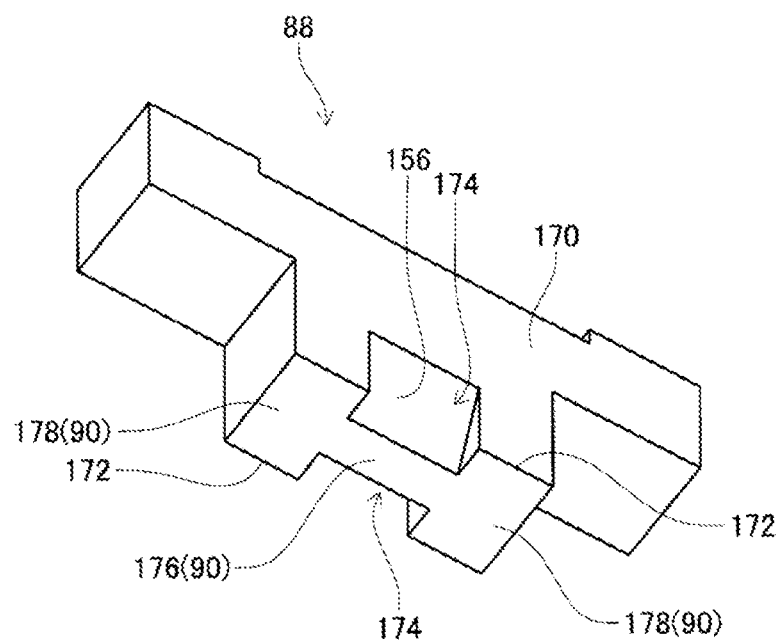
FIG. 9 is a perspective view showing the contact block of the component gripping tool of FIG. 3.
Figure 10:
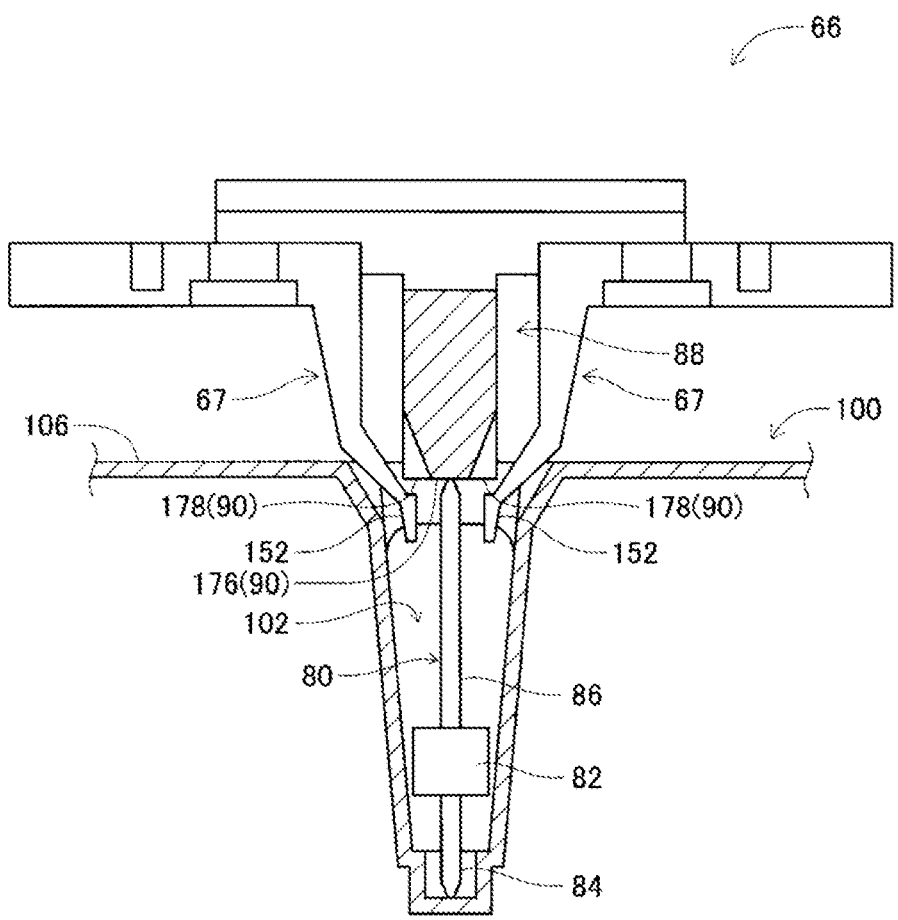
FIG. 10 is a cross-sectional view of the component gripping tool of FIG. 3.

In detail, as shown in FIG. 9, recess 174 is formed in the center open block section 172 at which contact surface 90 and side surface 170 of contact block 88 intersect. Recess 174 has a shape in which the center of block section 172 is cut out from contact surface 90 to side surface 170, and is formed at a position facing bent section 162 of arm section 150. The bottom surface of recess 174 serves as tapered surface 156. Note that, recess 174 is formed on the pair of side surfaces 170 and contact surface 90 facing the pair of arm sections 150 of contact block 88, and the pair of recesses 174 formed on the pair of side surfaces 170 are symmetrically shaped.

In this manner, contact block 88 is formed with recesses 174 extending from contact surface 90 to side surface 170 such that contact surface 90 is substantially H-shaped. Therefore, a portion of contact surface 90 where the recess 174 is formed, that is, a widthwise center section of contact surface 90 is concave and has a small thickness dimension. On the other hand, a portion of contact surface 90 where recess 174 is not formed, that is, both end portions of contact surface 90 in the widthwise direction, have a large thickness dimension. That is, contact surface 90 has first surface 176 having a small thickness dimension at the center in the width direction and second surface 178 having a large thickness dimension at both ends in the width direction. Note that, the thickness dimension of second surface 178 is made longer than the distance between the pair of gripping sections 152 when the pair of claws 67 are furthest separated from each other. Also, first surface 176 and second surface 178 are a single continuous surface.

Further, the bottom surface of recess 174, that is, the taper angle of tapered surface 156 is substantially the same as the bending angle of bent section 162 of arm section 150. Also, the width dimension of recess 174 is slightly larger than the width dimension of bent section 162. Thus, when pair of claws 67 close, bent section 162 of arm section 150 enters recess 174 of contact block 88, as shown in FIG. 3. In this manner, contact block 88 is provided between arm section 150 of pair of claws 67 without interference occurring between arm section 150 and contact block 88.

With such a configuration, the lower end sections of pair of claws 67 are inserted into accommodation recess 102 of taped components 100 by lowering work head 60 to which component gripping tool 66 is attached while pair of claws 67 are separated from each other. Here, the lower ends of pair of claws 67 are inserted into accommodation recess 102 such that upper pins 86 of electronic component 80 housed in accommodation recess 102 are positioned between gripping sections 152 of pair of claws 67. Then, in accordance with the lowering of component gripping tool 66, the upper ends of the three upper pins 86 of electronic component 80 contact the contact surface 90 of contact block 88 positioned between pair of claws 67. Here, the upper pin 86 in the center of the three upper pins 86 contacts first surface 176 of contact surface 90, and the upper pins 86 at both ends of the three upper pins 86 contact second surface 178 of contact surface 90. Further, by closing pair of claws 67, the three upper pins 86 are gripped by gripping sections 116 of pair of claws 67.

Figure 11:
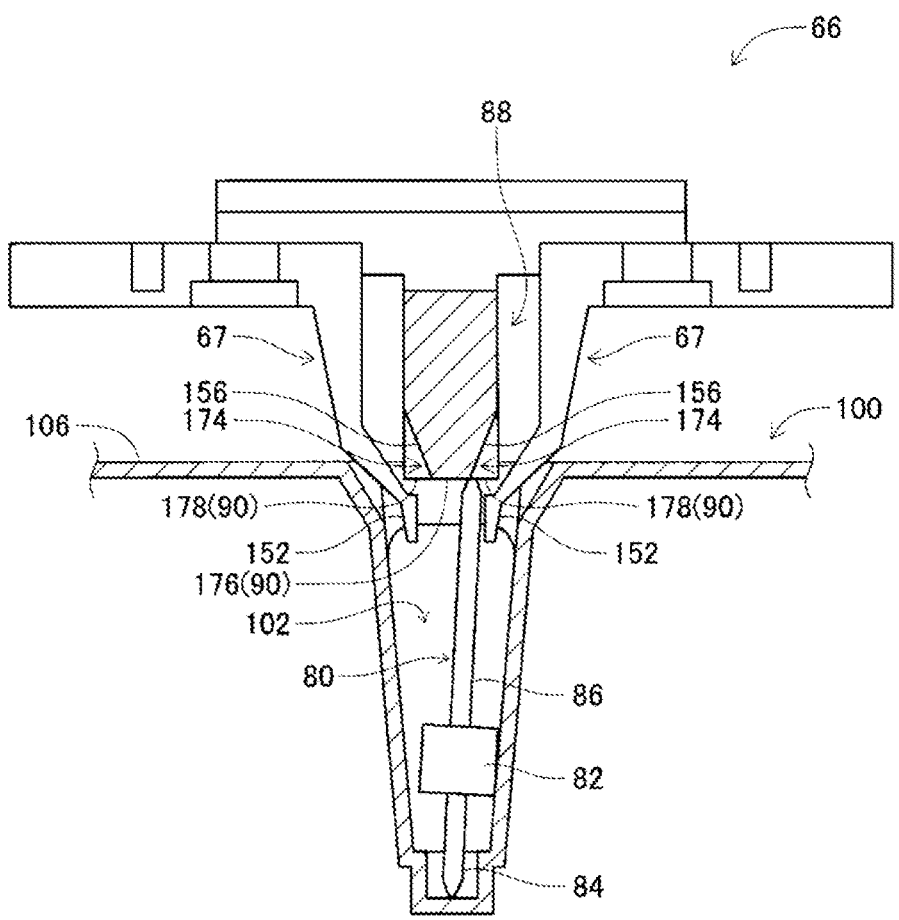
FIG. 11 is a cross-sectional view of the component gripping tool of FIG. 3.
Figure 12:
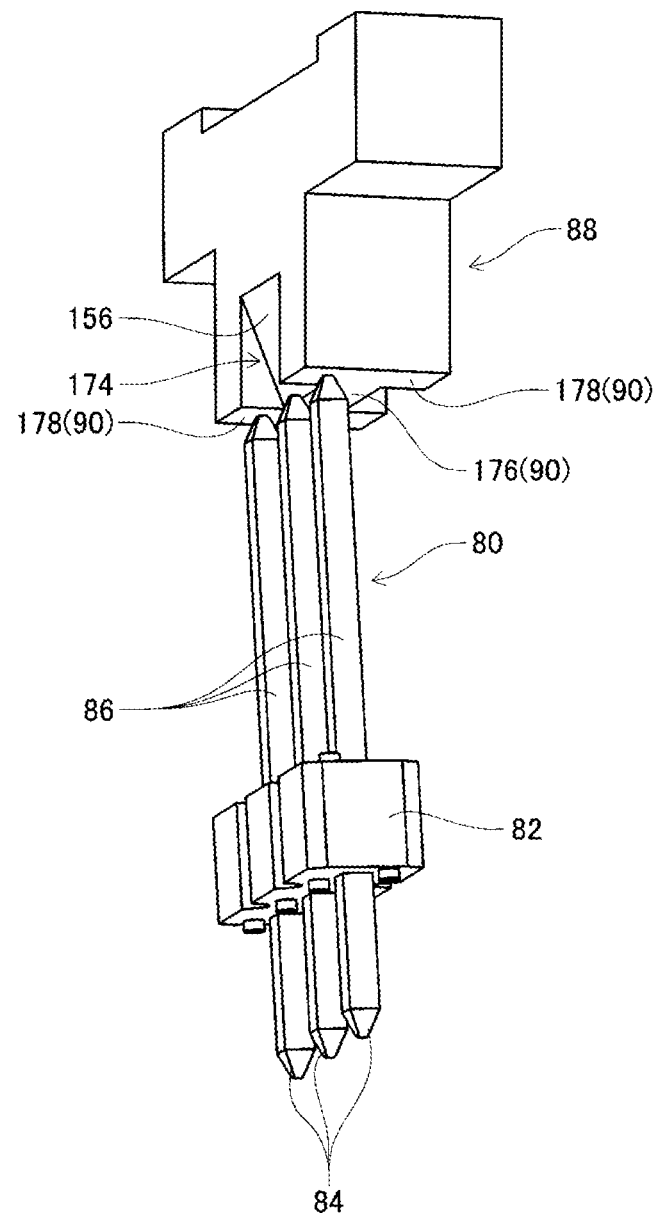
FIG. 12 is a perspective view of the upper pins of the inclined electronic component contacting the contact block.

In addition, even when electronic component 80 is inclined inside accommodation recess 102, upper pins 86 of electronic component 80 can be properly gripped by component gripping tool 66. In detail, as shown in FIGS. 11 and 12, when electronic component 80 is inclined inside accommodation recess 102, the upper pin 86 in the central of the three upper pins 86 of electronic component 80 inserted between the lower ends of pair of claws 67 does not contact first surface 176 of contact surface 90 of contact block 88. Note that, in FIG. 12, taped components 100, claws 67, and the like are omitted.

On the other hand, of the three upper pins 86 of electronic component 80 inserted between the lower ends of pair of claws 67, the upper pins 86 at both ends contact second surface 178 of contact surface 90 of contact block 88. In particular, since the thickness of second surface 178 is larger than the distance between pair of gripping sections 152 when pair of claws 67 are furthest separated from each other, the upper pins 86 at both ends contact second surface 178 even when electronic component 80 is inclined by a large amount. Therefore, the upper end of the upper pin 86 of the three upper pins 86, which is not in contact with contact surface 90, does not enter inside recess 174.

When pair of claws 67 close with the upper pins 86 at both ends of the three upper pins 86 that determine the length dimension of the upper pins 86 in the side-by-side direction contact the contact surface 90 of contact block 88, the three upper pins 86 are pushed by gripping section 152 of claw 67 to swing. This corrects the incline of electronic component 80 such that the three upper pins 86 contact the contact surface 90 of contact block 88. In other words, the upper pin 86 in the center of the three upper pins 86 contacts first surface 176 of contact surface 90, and the upper pins 86 at both ends of the three upper pins 86 contact second surface 178 of contact surface 90. Further, by closing pair of claws 67, the three upper pins 86 are gripped by gripping sections 152 of pair of claws 67. Thus, with component gripping tool 66, even when electronic component 80 is inclined inside accommodation recess 102, the upper pins 86 of electronic component 80 can be gripped by gripping sections 152 while contacting contact surface 90.

Note that, component gripping tool 66 is an example of a component gripping tool. Claw 67 is an example of a claw. Electronic component 80 is an example of an electronic component. Upper pin 86 is an example of a pin or lead. Contact surface 90 is an example of a contact surface. Recess 174 is an example of an escape section and a recess.

Figure 13:
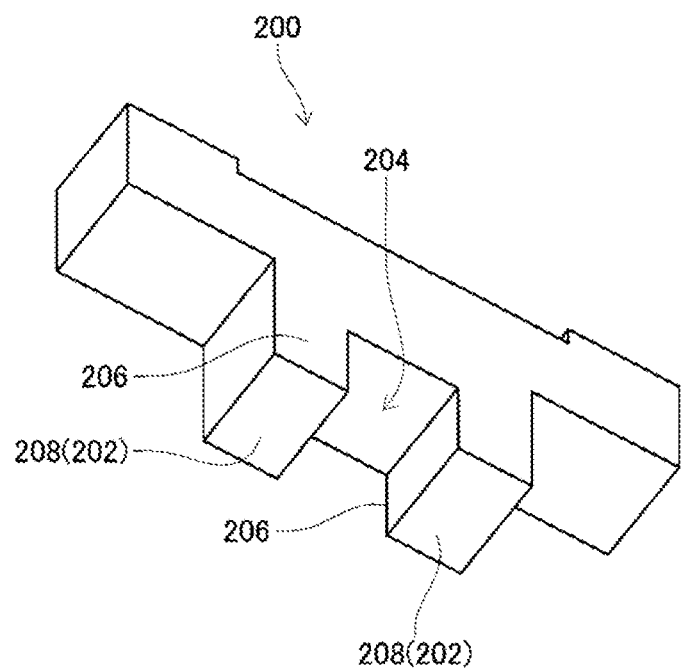
FIG. 13 is a perspective view showing an alternative contact block.
Figure 14:
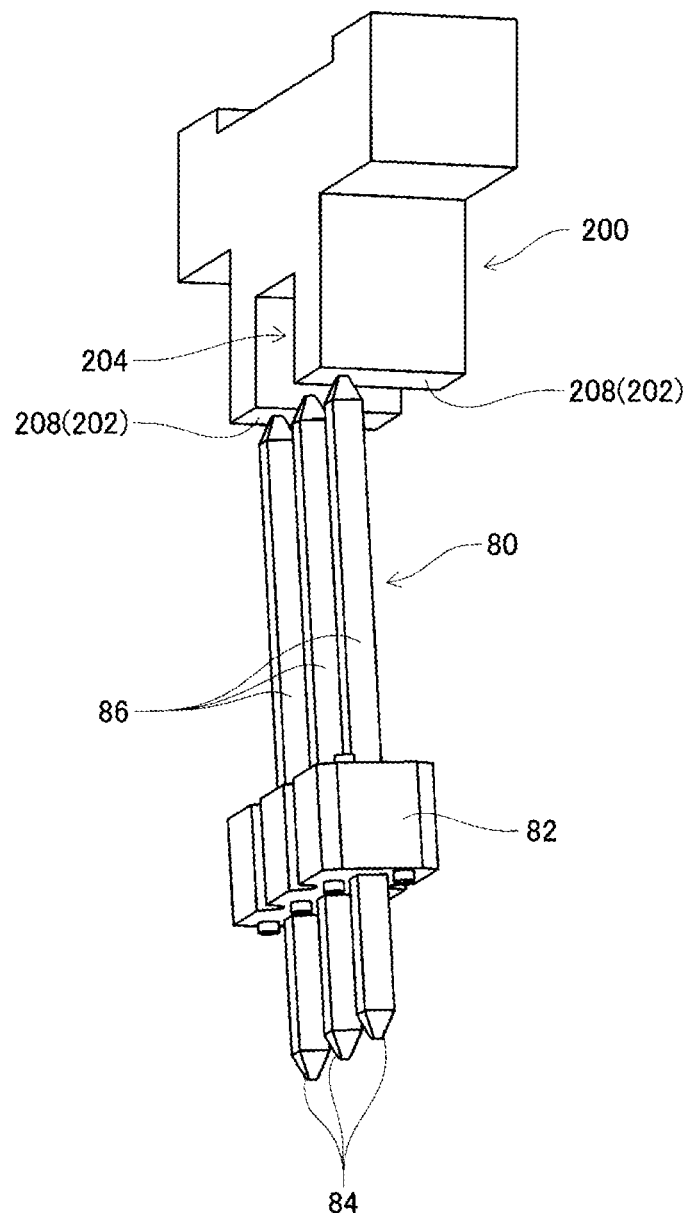
FIG. 14 is a perspective view of the upper pins of the inclined electronic component contacting the contact block of FIG. 13.

Further, the present disclosure is not limited to the above example embodiments, and various changed or improved methods of embodiment are possible based on the knowledge of someone skilled in the art. Specifically, for example, in an embodiment described above, first surface 176 and second surface 178 are a single continuous surface on contact surface 90 of contact block 88, but the contact surface may be a surface which is not a single continuous, that is, may be a non-continuous surface. Specifically, as shown in FIG. 13, recess 204 is formed on the bottom surface of contact block 200, that is, on contact surface 202. Recess 204 is cut out from contact surface 202 to pair of side surfaces 206. In other words, contact surface 202 of contact block 200 is divided by the recess at a center section in the width direction, and is formed into two third surfaces 208. When contact block 200 having such a structure is used, if electronic component 80 is inclined as shown in FIG. 14, the upper pins 86 at both ends of the three upper pins 86 abut against contact surface 202, that is, third surfaces 208. As a result, for a component gripping tool provided with contact block 200, a similar effect as that of component gripping tool 66 described above can be achieved. Note that, with a component gripping tool provided with contact block 200, the upper pins 86 at both ends of the three upper pins 86, that is, two upper pins 86, contact the contact surface 202.

Further, in an embodiment described above, the disclosure is applied to electronic component 80 having lower pins 84 and upper pins 86, however, the disclosure may be applied to various types of components so long as they have upper pins 86. That is, the present disclosure can be applied to an electronic component having multiple pins which are gripped by pair of claws 67 of component gripping tool 66. Note that, it is easy to apply the present disclosure in various modes in which two or more upper pins of an electronic component having multiple upper pins are brought into contact with a contact surface. For example, two or more upper pins of an electronic component having multiple upper pins that contact a contact surface may be selected asymmetrically, and the contact surface may be asymmetrically shaped. Similarly, it is not necessary to grip all the upper pins, and the upper pins to be gripped may be selected asymmetrically. In addition, the length of the dimension in which the upper pins are lined up side by side may exceed the widthwise dimension of the gripping section of the claw or the contact surface. In other words, there may be no relationship between the upper pins gripped by the gripping section and the upper pins contacting the contact surface.

Note that, since contact block 88 of an embodiment described above is a consumable part, one portion of component holding tool 66 may be configured to be exchangeable, or main body section 166 that makes up the main body of component holding tool 66 may be configured integrally with contact block 88.

Further, the present disclosure may also be applied to an electronic component accommodated in a tray having multiple cavities formed from multiple accommodation recesses, an electronic component supplied in an inclined state, or the like.

REFERENCE SIGNS LIST

66: component gripping tool;
67: claw;
80: electronic component;
86: upper pin (pin) (lead);
90: contacting surface;
174: recess (escape section);
202: contacting surface;
204: recess (escape section)

The invention claimed is:

1. A component gripping tool comprising:
a pair of claws configured to grip multiple pins or leads of an electronic component; and
a contact block, the contact block includes side surfaces and a contact surface, the contact surface being provided between the pair of claws, the contact surface contacts a leading end of at least two of the multiple pins or leads being gripped by the pair of claws, the contact surface facing in a direction of the at least two of the multiple pins or leads,
wherein an escape section is formed at a position where the contact surface and side surfaces intersect such that the escape section is partially formed in each of the contact surface and the side surfaces, and
wherein the pair of claws and the contact surface do not interfere with each other when the pair of claws is gripping the multiple pins or leads.

2. The component gripping tool according to claim 1, wherein
the contact surface is a single continuous surface.

3. The component gripping tool according to claim 2, wherein
the escape section is a pair of recesses formed at an edge section of the contact surface facing the pair of claws, and
the pair of recesses is formed in a symmetrical manner.

4. The component gripping tool according to claim 1, wherein
the contact surface is not a single continuous surface.

* * * * *